US008340304B2

(12) United States Patent
Chun

(10) Patent No.: US 8,340,304 B2

(45) **Date of Patent: *Dec. 25, 2012**

(54) METHOD AND APPARATUS TO GENERATE SPATIAL SOUND

(75) Inventor: Ingyu Chun, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1273 days.

This patent is subject to a terminal disclaimer.

(21) Appl. No.: 11/518,931

(22) Filed: Sep. 12, 2006

(65) Prior Publication Data

US 2007/0074621 A1 Apr. 5, 2007

(30) Foreign Application Priority Data

Oct. 1, 2005 (KR) ........................ 10-2005-0092658
Oct. 24, 2005 (KR) ........................ 10-2005-0100403

(51) Int. Cl.
*H04R 5/00* (2006.01)
*H03G 3/00* (2006.01)

(52) U.S. Cl. ........................................... 381/17; 381/63

(58) Field of Classification Search .................... 381/17, 381/1, 18, 61, 63, 309, 310; 84/630
See application file for complete search history.

(56) References Cited

U.S. PATENT DOCUMENTS 5,491,754 A 2/1996 Jot et al.
5,621,801 A 4/1997 Kunimoto et al.
5,822,438 A * 10/1998 Sekine et al. .................. 381/17
5,841,879 A * 11/1998 Scofield et al. ............... 381/309
6,118,875 A * 9/2000 Møller et al. ..................... 381/1
6,243,476 B1 * 6/2001 Gardner ........................ 381/303
6,771,778 B2 * 8/2004 Kirkeby .......................... 381/17
6,937,737 B2 * 8/2005 Polk, Jr. ........................ 381/300
7,333,622 B2 * 2/2008 Algazi et al. .................. 381/310
7,440,575 B2 * 10/2008 Kirkeby ............................ 381/1
7,676,047 B2 * 3/2010 Aylward et al. ................. 381/97
7,787,638 B2 * 8/2010 Lokki et al. ...................... 381/92
2002/0041695 A1 * 4/2002 Luo .............................. 381/313
2004/0234093 A1 * 11/2004 Kawakami .................... 381/335
2005/0089174 A1 4/2005 Kawano et al.

FOREIGN PATENT DOCUMENTS

CN 1237848 12/1999
CN 1547186 11/2004
GB 2 369 976 6/2002

(Continued)

OTHER PUBLICATIONS

Korean International Search Report dated Jan. 16, 2007 issued in PCT/KR2006/003867.
Chinese Office Action issued Aug. 28, 2009 in CN Application No. 2006800366204.

(Continued)

*Primary Examiner* — Hai Phan
(74) *Attorney, Agent, or Firm* — Stanzione & Kim, LLP

(57) ABSTRACT

A spatial sound generation method and apparatus by which reflected sounds of an input sound signal are generated and by using the reflected sounds, a spatial sound is generated. The method includes delaying an input signal by applying a specified number of a plurality of delay values to the input signal to generate the specified number of a plurality of reflected sound signals, multiplying each of the delayed reflected sounds by a respective predetermined gain value, and generating additional reflected sounds from each of the gain-multiplied reflected sounds through a feedback loop comprises a delay value and a gain value that are specific for its corresponding gain-multiplied reflected sound signal.

3 Claims, 11 Drawing Sheets

FOREIGN PATENT DOCUMENTS

| | | |
|---|---|---|
| JP | 09-65496 | 3/1997 |
| KR | 2001-33932 | 4/2001 |
| KR | 2003-80040 | 10/2003 |
| KR | 2005-533 | 1/2005 |

OTHER PUBLICATIONS

EP Search Report issued May 2, 2011 in EP Patent Application No. 06798950.9.

* cited by examiner

METHOD AND APPARATUS TO GENERATE SPATIAL SOUND

CROSS-REFERENCE TO RELATED APPLICATIONS

This application claims the benefit of Korean Patent Application No. 10-2005-0092658, filed on Oct. 1, 2005 and No. 10-2005-0100403, filed on Oct. 24, 2005, in the Korean Intellectual Property Office, the disclosures of which are incorporated herein in their entirety by reference.

BACKGROUND OF THE INVENTION

1. Field of the Invention

The present general inventive concept relates to a spatial sound system, and more particularly, to a spatial sound generation method and apparatus by which reflected sounds of an input sound signal are generated, and by using the reflected sounds, a spatial sound is generated.

2. Description of the Related Art

Generally, a spatial sound generation apparatus creates a virtual sound source at a predetermined position of a virtual room through headphones or speakers disposed at predetermined locations, and generates a direction effect, a distance effect, and a spatial effect, to make it appear as if the sound that a listener listens to comes from the virtual sound source. For example, the spatial sound generation apparatus generates a spatial sound signal by using reflected sounds, so that the listener can experience a spatial effect and spatial effect through 2-channel headphones, earphones, or speakers.

FIG. 1 is an echogram illustrating a conventional method of generating a reflected sound.

Referring to FIG. 1, the echogram includes a direct sound (non-reflected sound), an early reflected sound, and a late reflected sound (reverberation sound).

The early reflected sound usually uses a tapped delay line method with a tapped delay line including a delay filter and multipliers. The tapped delay line method performs a type of finite impulse response (FIR) filtering, and requires tens to hundreds of delay filters, multipliers, and adders in order to generate tens to hundreds of early reflected sounds.

Also, the late reflected sound is artificially generated by using a Schroeder reverberator as illustrated in FIG. 2. The Schroeder reverberator is mentioned in U.S. Pat. No. 5,491,754, titled "Method and System for Artificial Spatialisation of Digital Audio Signals," and filed on Feb. 19, 2003.

This Schroeder reverberator includes four parallel-connected feedback comb filters and two serially-connected all-pass filters. An input sound signal x(z) is transferred in parallel through the four feedback comb filters, which have different delay values and gain values, and then added up and output. The added outputs of the four feedback comb filters are transferred through the two serially connected all-pass filters having different delay values and gain values to generate reflected sounds. Finally, the signal passing through the two all-pass filters is output as a sound signal y(z) having a spatial effect.

However, since the Schroeder reverberator does not provide positioning of the reflected sounds, the Schroeder reverberator does not consider directivity, and thus cannot produce sounds that are perceived by a listener to be directional, and is limited at least with respect to generating an accurate virtual spatial sound.

Accordingly, the conventional method of generating a spatial sound using reflected sounds requires a very large amount of computation due to a separate use of the tapped delay line and the artificial reverberator, and does not provide positioning of reflection sound sources.

Besides the conventional technology described above, there are methods using a Head Related Transfer Function (HRTF) in order to generate a more accurate spatial sound.

However, since these methods using the HRTF require a very large amount of computation, they are not suitable for portable sound devices.

SUMMARY OF THE INVENTION

The present general inventive concept provides a spatial sound generation method and apparatus capable of providing an effective spatial feeling with a small amount of computation by patternizing a reflected sound and providing a spatial feeling by positioning a plurality of reflected sounds.

Additional aspects and advantages of the present general inventive concept will be set forth in part in the description which follows and, in part, will be obvious from the description, or may be learned by practice of the general inventive concept.

The foregoing and/or other aspects and utilities of the present general inventive concept are achieved by providing a method of generating a spatial sound including: delaying an input signal according to a plurality of different delay values to generate a plurality of reflected sounds; multiplying each of the delayed reflected sounds by a different predetermined gain value; and generating additional reflected sounds by applying a feedback loop that reflects different delay values and gain values to respective multiplied reflected sounds.

The delay values different from each other may be determined based on a size of a predetermined virtual room, and the gain values different from each other may be determined based on a degree of sound absorption of the virtual room.

The foregoing and/or other aspects and utilities of the present general inventive concept may also be achieved by providing an apparatus to generate a spatial sound including: a delay filter unit to delay one channel signal according to a plurality of different delay values to generate a plurality of reflected sounds; a gain adjusting unit to multiply each of the reflected sounds generated in the delay filter unit by a different predetermined gain value; a feedback comb filter unit to generate additional reflected sounds by applying a feedback loop to reflect different delay values and gain values to respective multiplied reflected sounds; a positioning filter unit to separate each of the reflected sounds generated in the feedback comb filter unit into a first channel signal and a second channel signal, by applying a time difference of times taken to arrive at two ears (or two other sound receiving objects) and a sound pressure difference; and a mixer unit to add all the first channels of each reflected sounds, and to add all the second channels of each reflected sound.

The positioning filter unit may include: an ITD filter to reflect the time difference between the two ears; and an ILD filter to reflect the level difference between the two ears, and the positioning filter unit may output one channel signal without change and output the other channel signal through the ITD filter and the ILD filter.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
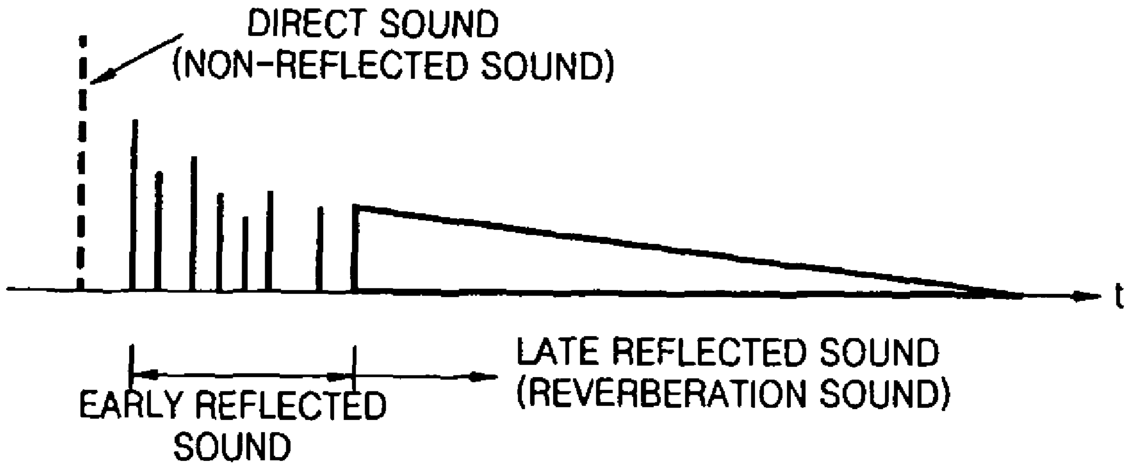
FIG. 1 (PRIOR ART)
FIG. 1 is an echogram illustrating a conventional method of generating a reflected sound.
Figure 2:
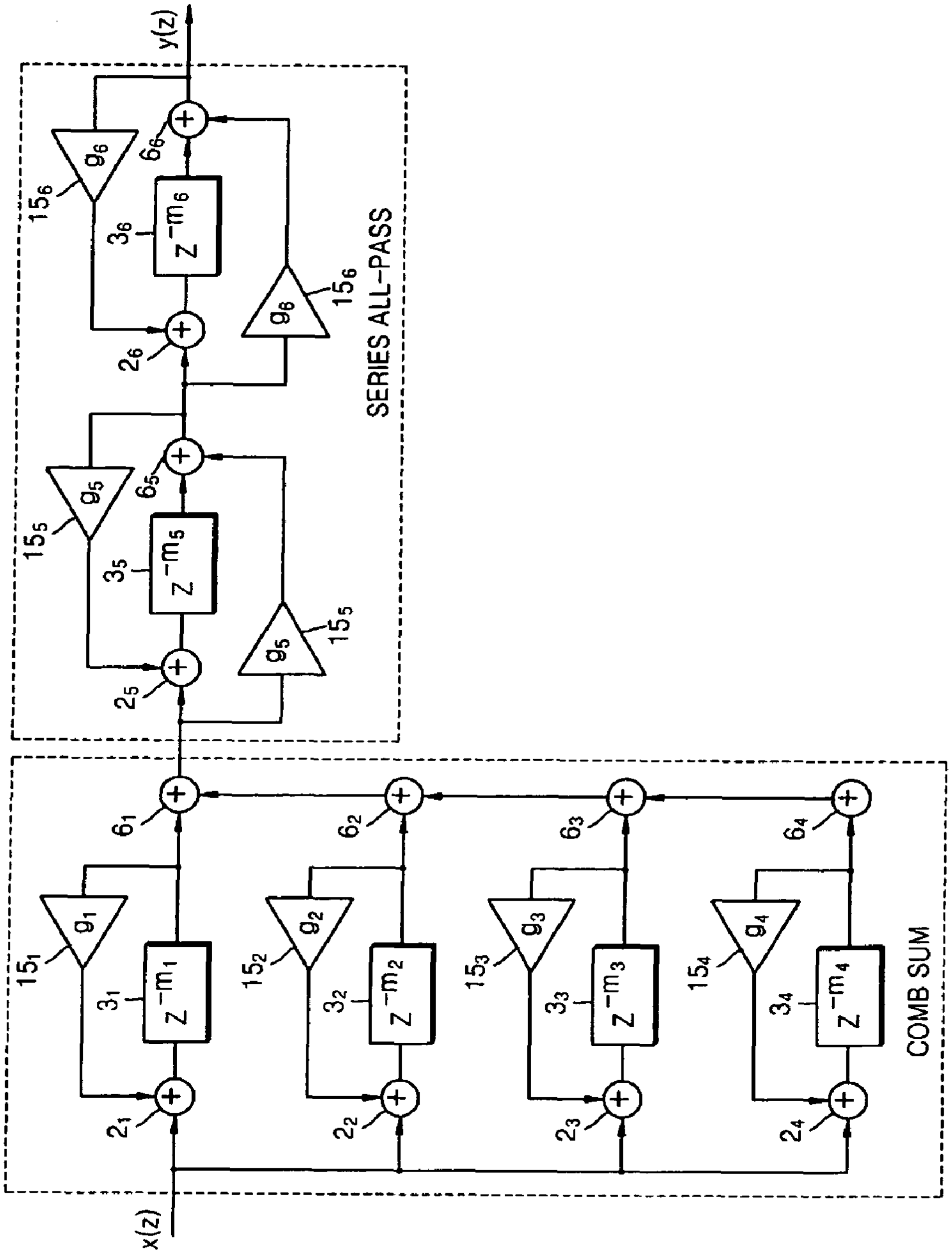
FIG. 2 (PRIOR ART)
FIG. 2 is a block diagram of a conventional apparatus for generating a spatial sound.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

The present general inventive concept generates a 2-channel stereo sound signal reflecting a stereo effect and a spatial effect from one channel input signal in each channel and uses 2-channel headphones, earphones, or speakers so that a listener can experience a stereo effect and a spatial effect.

The method of obtaining the stereo and spatial effect provides a stereo surround effect which makes a listener (or other sound receiving object) feel as if surrounded by sound, by arranging a plurality of virtual sound sources around the listener. Also, by avoiding in-head localization, which is easily caused by headphones or earphones, the listener is made to feel as if the sound image is localized outside the head. To achieve this, the present general inventive concept designs a virtual room and generates a plurality of reflected sounds such that the listener can experience a sound image effect as if the listener is in a virtual room.

In relation to generation of a stereo sound, the relative direction of a sound source is perceived by a listener due to differences in sound pressure of signals incident on the listener's ears.

Figure 3:
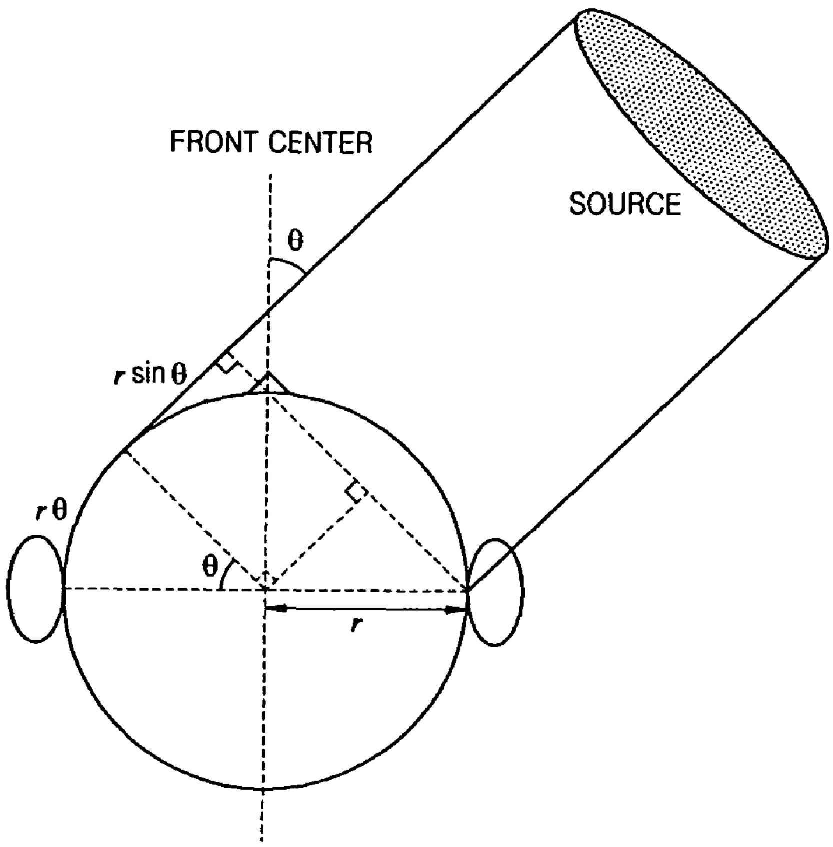
FIG. 3 is a conceptual diagram illustrating a time difference between two ears.

Representative perceptions of the direction of a sound source are perceptions by an interaural time difference (ITD) and an interaural level difference (ILD). The ITD indicates a time difference of signals transferred to two ears of a listener caused by a length difference of the paths from a sound source to the two ears, as illustrated in FIG. 3. One way of expressing the ITD is illustrated below in equation 1:

$$ITD=r(\theta+\sin\theta)/C_0 \quad (1)$$

where $C_0$ denotes the velocity of sound and is about 344 m/s.

The ITD can be effectively perceived in a low frequency band equal to or less than about 700 Hz.

Meanwhile, the ILD indicates an amplitude difference or level difference of signals transferred to two ears of a listener. The ILD is caused by diffusion of sound occurring mainly in the head and ears.

Accordingly, by perceiving the ITD and ILD, the positioning of a sound source can be ascertained. That is, the ITD can be implemented by a delay value and the ILD can be implemented by adjusting a gain.

Generally, when a stereo sound signal is listened to with headphones or earphones, the sound image is formed inside the head (or between two ears) in many cases. If the sound image is moved so that the sound image is perceived as if the sound comes from two speakers, then the listener can experience a stereo effect.

Meanwhile, in a headphones reproducing system, if a stereo sound is not accurately reproduced or not provided, the in-head localization phenomenon in which a sound image is formed inside the head of the listener is likely to occur. Accordingly, by adding reflected sounds generated in a virtual room to the reproduced sound of the headphones, the in-head localization phenomenon can be removed and the sound image can be made to be formed at a desired location outside the head.

Figure 4:
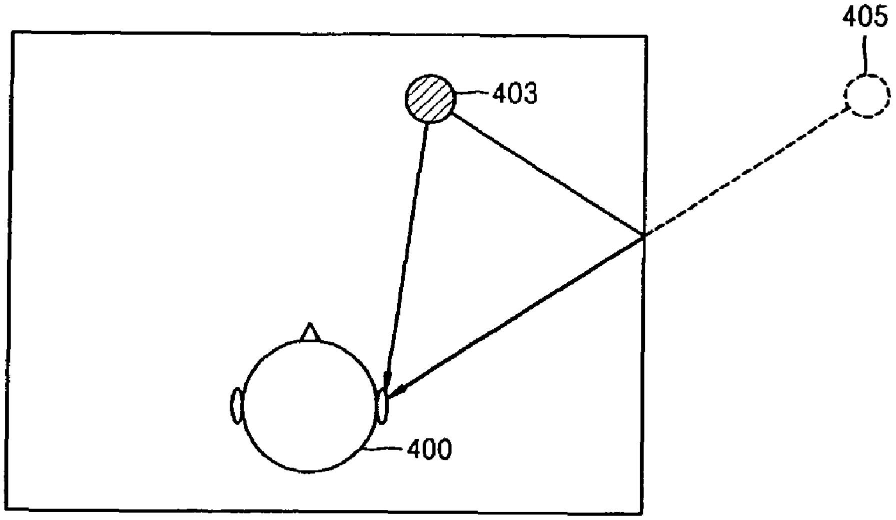
FIG. 4 is a conceptual diagram illustrating generation of a reflected sound in a virtual room according to an embodiment of the present general inventive concept.

As illustrated in FIG. 4, a reflected sound can be implemented from a simple structural model of a room. FIG. 4 illustrates a mirror image source of a sound source 403 in a given virtual room. The mirror image sound source 405 is a virtual sound source generated by the reflection of the sound source 403 with a surface of a virtual wall as an axis of symmetry. A reflected sound can be modeled by using the mirror image sound source (i.e., mirror image sound source 405) reflected on the virtual wall surface.

That is, the time it takes the reflected sound to travel from the sound source 403 to the ear of the listener 400 can be replaced by the time it takes to travel a straight line distance from the mirror image sound source 405 to the ear of the listener 400. Also, a strength of the reflected sound can be calculated from a strength of the mirror image sound source 405 depending on a degree of sound absorption of the wall surface. Virtual sound sources as well as the original sound source are generated again as an infinite number of sound sources by the sounds reflected by the wall surface of the virtual room. Among the infinite number of virtual sound sources, a finite number of sound sources are set at an appropriate level. Then, the delay time and strength of each virtual sound source are calculated. Then, the ITD and ILD of each virtual sound source are calculated with respect to the incident angle on the listener. Each parameter to be calculated can vary depending on the shape of a given room, a boundary condition, and the positions of the listener and the sound source. Accordingly, in order to generate effective reflected sounds, a virtual room should be designed appropriately.

Figure 5:
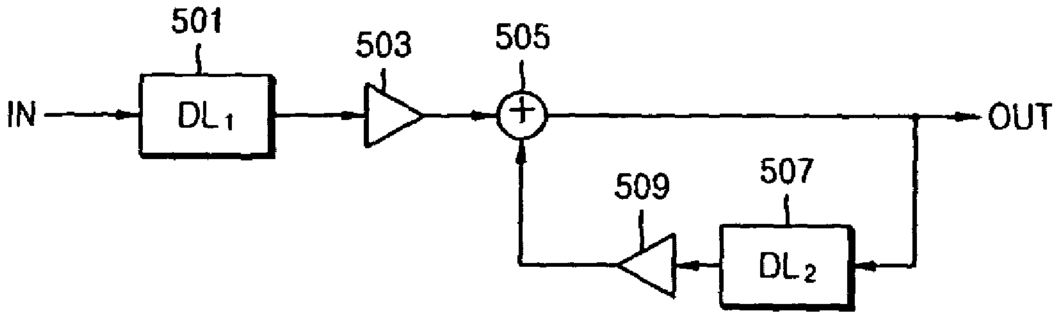
FIG. 5 is a block diagram of a basic unit block used in an apparatus to generate a spatial sound according to an embodiment of the present general inventive concept.

FIG. 5 is a block diagram of a basic unit block used in an apparatus to generate a spatial stereo sound, according to an embodiment of the present general inventive concept.

Referring to FIG. 5, the unit block performs patternization of reflected sounds reflected by any one wall surface of a virtual room. By using a first delay unit 501 and a first gain adjuster 503, a first reflected sound is generated, and a reflected sound pattern related to the first reflected sound is generated through a feedback comb filter including an adder 505, a second delay unit 507, and a second gain adjuster 509.

Figure 6:
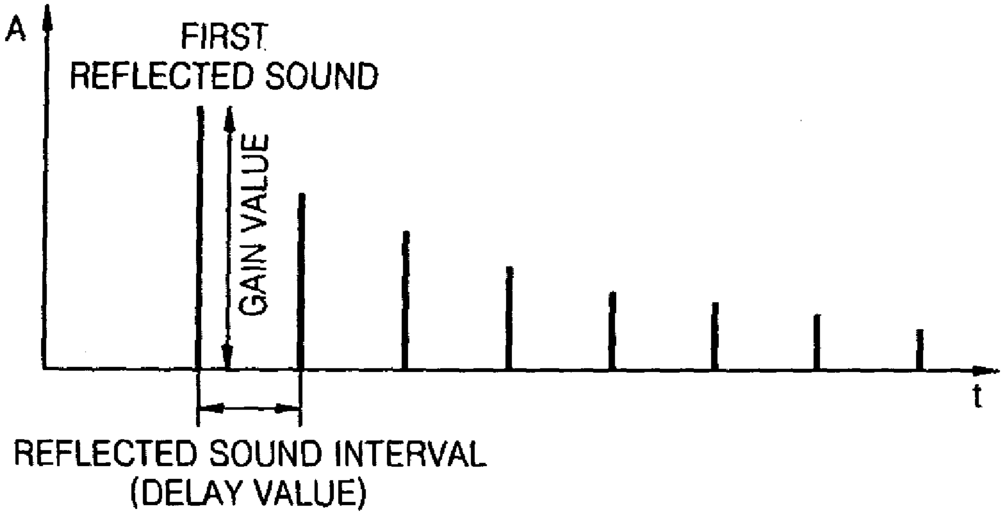
FIG. 6 illustrates a pattern of a reflected sound produced by the operation of the basic unit of FIG. 5.

The first delay unit 501 and the first gain adjuster 503 generate a first reflected sound signal of an input signal as illustrated in FIG. 6. That is, the input signal is delayed by a delay value of the first delay unit 501, and then the gain of the input signal is adjusted by a gain value of the first gain adjuster 503. At this time, if the delay value of the first delay unit 501 and the gain value of the first gain adjuster 503 are appropriately adjusted, a signal identical to a reflected sound of the input signal can be generated in space.

The feedback comb filter including the adder 505, the second delay unit 507, and the second gain adjuster 509, continuously generates additional reflected sound patterns related to the first reflected sound as illustrated in FIG. 6. That is, the feedback comb filter generates a second reflected sound, a third reflected sound, . . . , an n-th reflected sound as illustrated in FIG. 6. The pattern of the reflected sounds has an interval of the delay value set in the second delay unit 507, and is output with its level gradually decreasing according to the gain value set in the second gain adjuster 509. Accordingly, if the delay value of the second delay unit 507 and the gain value of the second gain adjuster 509 are appropriately adjusted, a signal pattern very similar to the reflected sounds in space in the psychoacoustic aspect can be generated.

By adjusting the gain value of the second gain adjuster 509, the magnitude (strength) of a reflected sound fed back to the adder 505 can be adjusted. This corresponds to changing a mean sound absorption rate. Also, in order to change a spatial effect, only the delay value of the second delay unit 507 needs to be changed. That is, if the delay value of the second delay unit 507 is changed, a density of a reflected sound changes as a sound phenomenon and causes an acoustic change in the spatial effect.

Accordingly, if unit blocks of the structure as illustrated in FIG. 5 are connected in parallel, an apparatus to generate a spatial sound according to an embodiment of the present general inventive concept can be constructed.

Figure 7:
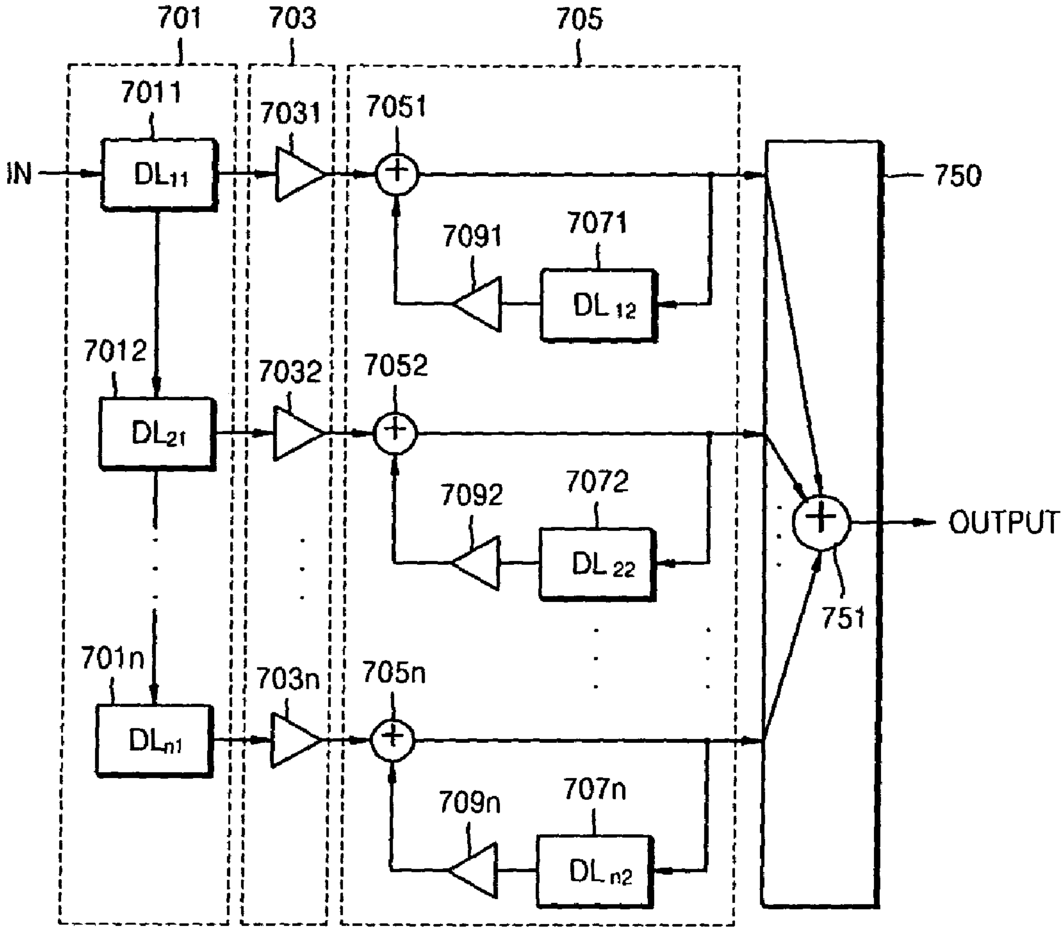
FIG. 7 is a block diagram of an apparatus to generate a spatial sound according to an embodiment of the present general inventive concept.

FIG. 7 is a block diagram of an apparatus to generate a spatial sound according to an embodiment of the present general inventive concept.

The spatial sound generating apparatus of FIG. 7 patternizes reflected sounds reflected by n wall surfaces of a virtual room, and includes a delay part 701, a gain adjusting part 703, a feedback comb filter part 705, and an addition unit 750. In the spatial sound generating apparatus according to the present embodiment, the unit blocks described above with respect to FIG. 5 are arranged in parallel, and the outputs of these unit blocks are added by the addition unit 750.

In the spatial sound generating apparatus of FIG. 7, the delay part 701 includes 11th through n1-th delay units 7011 through 701*n*, which delay an input signal (IN) by delay times t11, t21, . . . , tn1, respectively, and output the delayed signals. The gain adjusting part includes 11th through n1-th gain adjusters 7031 through 703*n*, which multiply the outputs of the 11th through n1-th delay units 7011 through 701*n*, by gain values g11, g12, . . . , gn1, respectively, and output the multiplied signals.

The delay values of the 11th through n1-th delay units 7011 through 701*n* can be set as delay times taken to travel from n mirror image sound sources, respectively, generated by a virtual sound source positioned in a virtual room, to a listener, and these values depend on the size of the virtual room.

The gain values g11, g12, . . . , gn1, are in proportion to relative sound pressure amounts of the n mirror image sound sources, respectively, generated by the virtual sound source, and these gain values are determined according to the boundary conditions of the virtual room.

The reflected sounds output in parallel from the gain adjusting part 703 are transferred to the feedback comb filter part 705. The feedback comb filter part 705 continuously generates a plurality of reflected sounds obtained by performing delaying and gain-adjusting of each of the reflected sounds input from the gain adjusting part 703, through a feedback loop. That is, from each of the reflected sounds output from the gain adjusting part 703, the feedback comb filter part 705 continuously generates additional reflected sound patterns. If it is assumed that the delay values of the feedback comb filter part 705 are t12, t22, . . . , tn1, and the gain values are g12, g22, . . . , gn2, each of these values can be set based on the reflection pattern in a virtual room. In this case, the absolute value of each of the gain values g11, g12, . . . , gn1 becomes less than 1.

The addition unit 750 generates one output signal by adding each reflected sound output from the feedback comb filter part 705.

FIGS. 8A-8D are signal pattern diagrams illustrating a method of generating a reflected sound in the apparatus to generate a spatial sound of FIG. 7, according to an embodiment of the present general inventive concept.

Figure 8A:
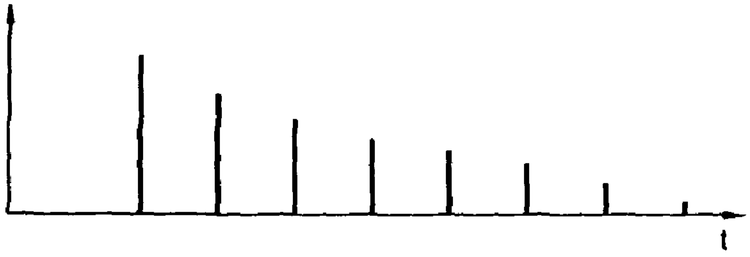
FIGS. 8A-8D are signal pattern diagrams illustrating a method of generating a reflected sound in the apparatus to generate a spatial sound of FIG. 7, according to an embodiment of the present general inventive concept.

FIG. 8A illustrates the first reflected sound generated through the 11th delay unit 7011 and the 11th gain adjuster 7031, and the reflected sound patterns continuously generated through the first feedback comb filter including an adder 7051, a gain adjuster 7091, and a delay unit 7071.

Figure 8B:

FIG. 8B illustrates the reflected sound generated through the 21st delay unit 7012 and the 21st gain adjuster 7032, and the reflected sound patterns continuously generated through the second feedback comb filter including an adder 7052, a gain adjuster 7092, and a delay unit 7072.

Figure 8C:

FIG. 8C illustrates the reflected sound generated through the n1th delay unit 701*n* and the n1th gain adjuster 703*n*, and the reflected sound patterns continuously generated through the n-th feedback comb filter including an adder 705*n*, a gain adjuster 709*n*, and a delay unit 707*n*.

Figure 8D:
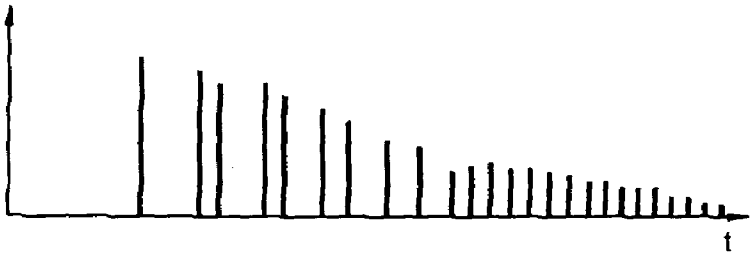

FIG. 8D illustrates reflected sounds finally output by adding the reflected sounds of FIGS. 8A through 8C, which are generated by the respective basic unit blocks.

Figure 9:
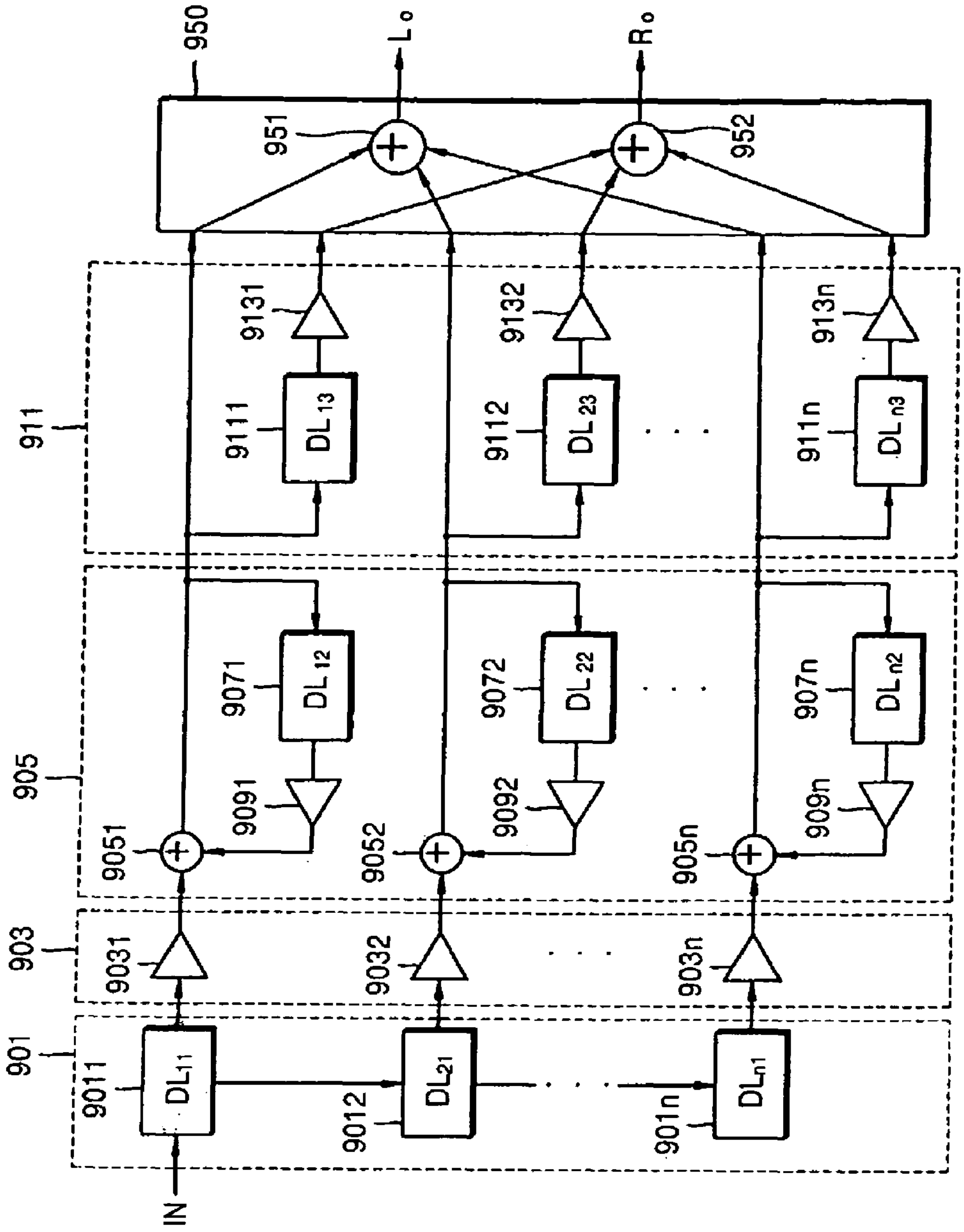
FIGS. 9 and 9A are block diagrams of an apparatus to generate a spatial sound according to another embodiment of the present general inventive concept.
Figure 9A:
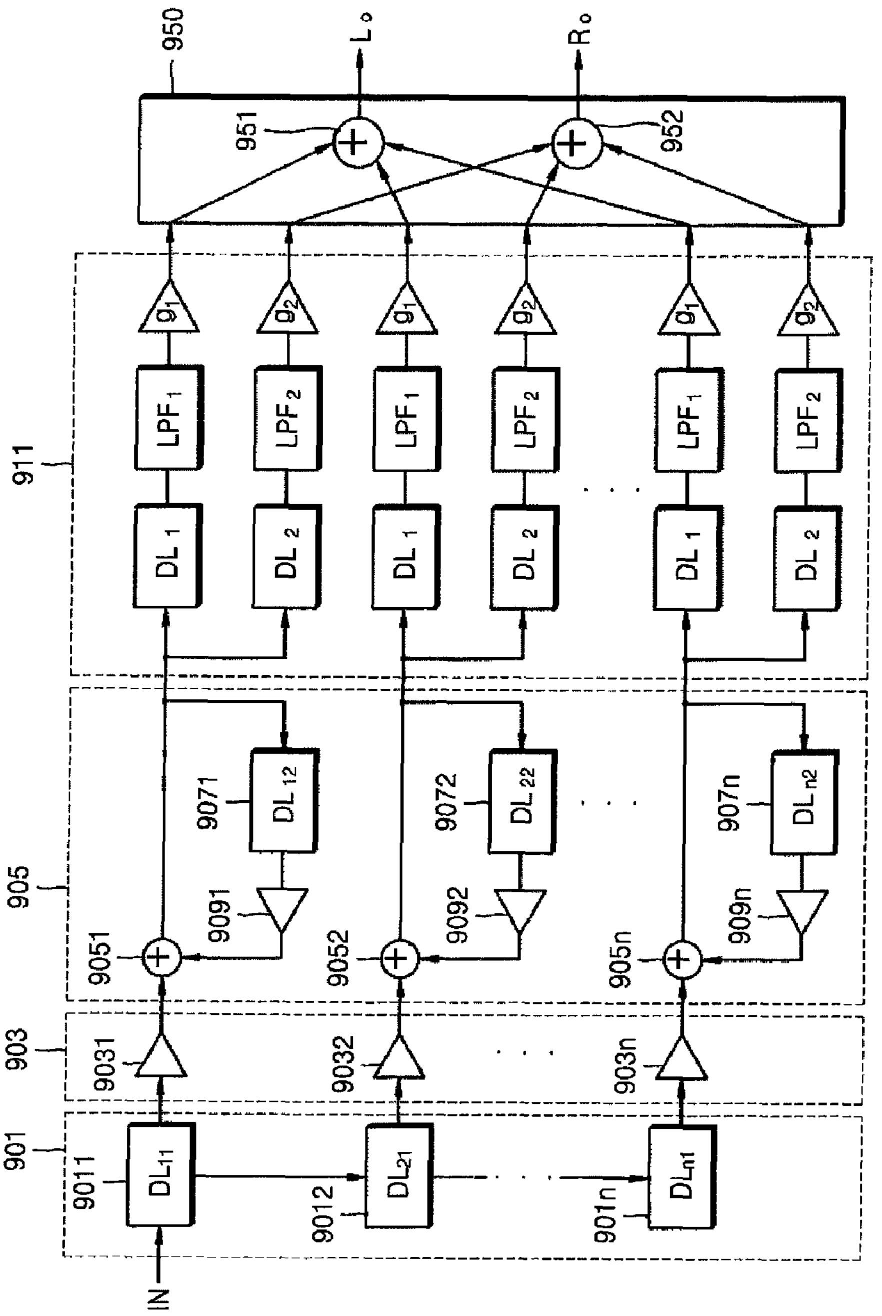

FIGS. 9 and 9A are block diagrams of an apparatus to generate a spatial stereo sound according to another embodiment of the present general inventive concept.

The spatial stereo sound generating apparatus of FIGS. 9 and 9A are different from the embodiment illustrated in FIG. 7 in that the embodiment of FIGS. 9 and 9A further include a positioning filter part 911 and a mixer part 950 instead of the addition part 750.

The functions and structures of a delay part 901, a gain adjusting part 903, and a feedback comb filter part 905 are the same as the corresponding parts described above with reference to FIG. 7. However, in the present embodiment, the positioning filter part 911 and the mixer part 950 are further included so that the signal output from the feedback comb filter part 905 is divided into left and right channels and a sound signal with an enhanced stereo effect is generated. Here, the positioning filter part 911 positions a reflected sound by applying characteristics such as the ITD, the ILD, and different ILDs with respect to frequency bands. In FIG. 9, the positioning filter part 911 includes delay filters and gain adjusters, but can be implemented as a variety of combinations by applying an ITD, an ILD, and different ILDs with respect to frequency bands as illustrated in FIG. 9A.

Referring to FIG. 9, the feedback comb filter part 905 generates a plurality of reflected sounds which are transferred to the positioning filter part 911 to move a sound image. Each reflected sound input to the positioning filter part 911 to move a sound image is separated into left and right channels, and a reflected sound belonging to one of the left and right channels is transferred to a delay filter and gain adjuster or an ILD filter.

For example, if it is assumed that the sound image of a reflected sound output through a first feedback comb filter including an adder 9051, a delay unit 9071, and a gain adjuster 9091 of the feedback comb filter part 905 is on the left hand side, this reflected sound belongs to the left channel signal and the reflected sound output through a 13th delay unit 9111 and gain adjuster 9131 or an ILD filter belongs to the right channel signal.

It is assumed that the delay values of the 13th through n3-th delay units 9111 through 911*n* of the positioning filter part 911 are t13, t23, . . . , tn3, and the gain values of the 13th through n3-th gain adjusters 9131 through 913*n* are g13, g23, . . . , gn3. The delay values t13, t23, . . . , tn3, and the gain values g13, g23, . . . , gn3 are selected to appropriately set the time and sound pressure differences of respective reflected sounds arriving at a listener's ears, and are dependent on the incident angles of the sounds. Accordingly, if the reflected sounds have different incident angles, respectively, a sound effect with a spatial effect can be generated.

The reflected sounds of the left and right channels output from the positioning filter part 911 are transferred to the mixer part 950.

The mixer part 950 adds together all of the left channel signals and all of the right channel signals of each reflected sound output from the positioning filter part 911.

That is, a first adder 951 adds together all of the left channel signals of each reflected sound separated in the positioning filter part 911 and outputs the result as a left channel signal (Lo), and a second adder 951 adds together all of the right channel signals of each reflected sound separated in the positioning filter part 911 and outputs the result as a right channel signal (Ro).

Finally, the left channel signal (Lo) and the right channel signal (Ro) output from the mixer part 950 are reproduced through headphones and the like so that the listener can listen to the stereo sound.

FIGS. 10A through 10F are various different embodiments of the positioning filter part 911 of FIG. 9.

Figure 10A:
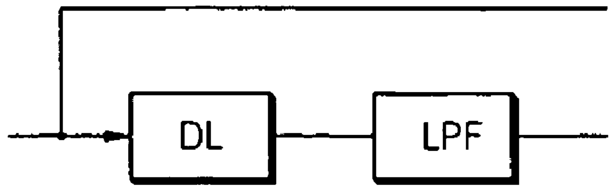
FIGS. 10A through 10F are various different examples of a positioning filter part of FIG. 9, according to various embodiments of the present general inventive concept.

Referring to FIG. 10A, the positioning filter part 911 can include a delay filter (DL) and a low pass filter (LPF) to realize an ITD and ILD, and a signal belonging to any one of left and right channels goes through the DL and the LPF.

Figure 10B:
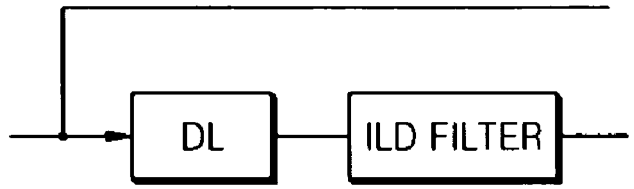

Referring to FIG. 10B, the positioning filter part 911 can include a DL and an ILD filter to realize an ITD and ILD, and a signal belonging to any one of left and right channels goes through the DL and the ILD filter.

Figure 10C:
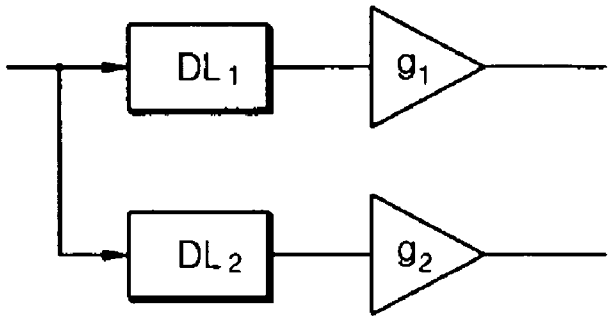

Referring to FIG. 10C, the positioning filter part 911 can include first and second DLs (DL1, DL2) and first and second gain adjusters (g1, g2) to realize an ITD and ILD, and left and right channel signals go through the first DL (DL1) and the first gain adjuster (g1) and the second DL (DL2) and the second gain adjuster (g2), respectively.

Figure 10D:
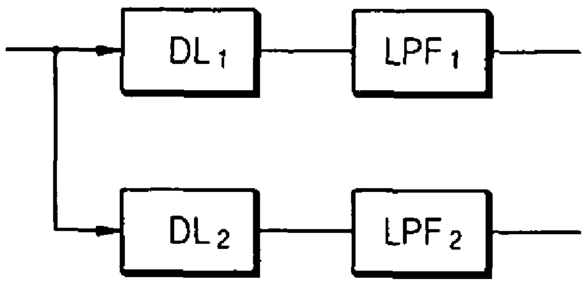

Referring to FIG. 10D, the positioning filter part 911 can include first and second DLs (DL1, DL2) and first and second LPFs (LPF1, LPF2) to realize an ITD and ILD, and left and right channel signals go through the first DL (DL1) and the first LPF (LPF1) and the second DL (DL2) and the second LPF (LPF2), respectively.

Figure 10E:
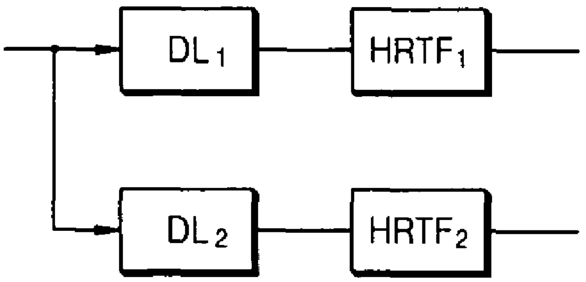

Referring to FIG. 10E, the positioning filter part 911 can include a first DL (DL1) and a first HRTF filter (HRTF1) and a second DL (DL2) and a second HRTF filter (HRTF2) for both channels, and the left and right channel signals go through the first DL (DL1) and the first HRTF filter (HRFT1) and the second DL (DL2) and the second HRTF filter (HRTF2), respectively.

Figure 10F:
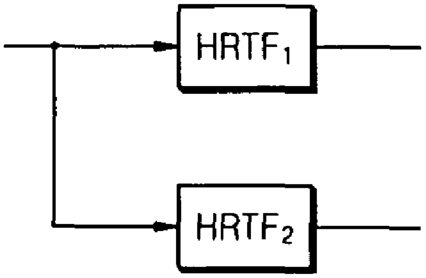

Referring to FIG. 10F, the positioning filter part 911 can include first and second HRTF filters (HRTF1, HRTF2) for both channels, and performs convolution operations of the left and right channels with the first and second HRTF filters (HRTF1, HRTF2), respectively.

Figure 11:
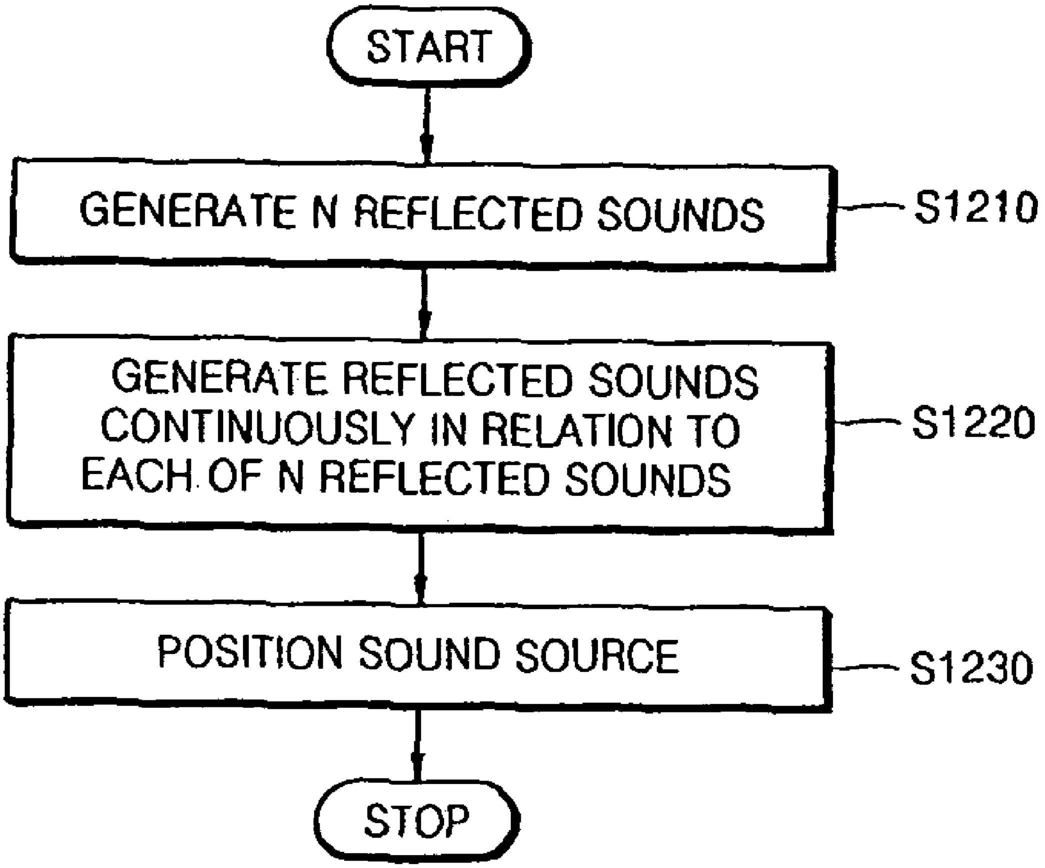
FIG. 11 is a flowchart of a method of generating a spatial sound according to an embodiment of the present general inventive concept.

FIG. 11 is a flowchart of a method of generating a spatial stereo sound according to an embodiment of the present general inventive concept.

First, n reflected sounds are generated through delay filters connected in parallel from an input signal in operation S1210.

The n reflected sounds can be generated by adjusting the delay and gain of the input signal using different delay values determined with respect to a size of a virtual room and different gain values determined with respect to boundary conditions of the virtual room.

From each of the generated n reflected sounds reflected sounds are continuously generated through a feedback loop in operation S1220.

Then, positioning of a sound image by applying a time difference of sounds incident on the left and right ears of a virtual listener and a sound pressure difference to each of the generated reflected sounds is performed in operation S1230.

Accordingly, the reflected sounds from the input signal are generated to provide a spatial effect and by positioning a plurality of virtual reflected sounds, a stereo effect can be generated.

While various embodiments of the present general inventive concept have been particularly illustrated and described, it will be understood by those of ordinary skill in the art that various changes in form and details may be made therein without departing from the spirit and scope of the present invention as defined by the following claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

The present general inventive concept can also be embodied as computer readable codes on a computer readable recording medium. The computer readable recording medium can be any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

According to the present general inventive concept as described above, by using reflected sounds generated with performing delaying and gain-adjusting of an input signal, a spatial stereo sound can be generated. Also, since the present general inventive concept effectively implements a stereo sound in a virtual room without using a HRTF, change in timber scarcely occurs and the amount of computation can be greatly reduced.

Accordingly, the present general inventive concept can be easily applied to mobile devices such as headphones and earphones, such that listeners can listen to a sound signal having a spatial stereo effect almost without change in timbre.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of generating a spatial sound in a predetermined virtual room, comprising:

receiving an input sound signal;

applying a specified number of a plurality of delay values to the input sound signal to generate the specified number of a plurality of reflected sound signals;

multiplying each of the reflected sound signals by a respective gain value that is based on an interaural level difference (ILD) to adjust the volume of each reflected sound signal;

applying a respective feedback loop to each of the gain-multiplied reflected sound signals, wherein each of the respective feedback loops comprises a delay value and a gain value that are specific for its corresponding gain-multiplied reflected sound signal, and where each respective feedback loop generates a reflected sound pattern using the respective delay and gain values, and where the respective reflected sound pattern is added to the respective gain-multiplied reflected sound to form a feedback loop output signal;

separating each of the feedback loop output signals generated from the adding of the respective reflected sound patterns to the respective gain-multiplied reflected sounds into a first channel reflected sound and a second channel reflected sound, by applying a time difference and the sound pressure difference between two ears of a listener to each of the first channel and second channel reflected sounds, by positioning the first channel reflected sound and the second channel reflected sound by applying an interaural time difference (ITD) and different ILDs with respect to frequency bands, and by assigning different delay values to the first channel reflected sound and the second channel reflected sound with respect to a different incident angle of each sound; and adding all the positioned first channel reflected sounds to form a first output channel, and adding all the positioned second channel reflected sounds to form a second output channel, wherein the respective time differences, sound pressure differences, and the ILDs that are the basis of the respective gain values are calculated based on a size, a shape, a degree of sound absorption of the predetermined virtual room, and a relative position of each of the two ears of the listener with respect to a respective sound source within the predetermined virtual room.

2. An apparatus to generate a spatial sound in a predetermined virtual room comprising:

a delay filter unit applying a specified number of a plurality of delay values to the input signal to generate the specified number of a plurality of reflected sound signals;

a gain adjusting unit to multiply each of the reflected sounds generated in the delay filter unit by a respective predetermined gain value;

a feedback comb filter unit to generate additional reflected sound signals by applying a respective feedback loop to each of the gain-multiplied reflected sound signals, wherein each of the respective feedback loops comprises a delay value and a gain value that is determined based on an interaural level difference (ILD) where the delay value and gain value are specific for its corresponding gain-multiplied reflected sound signal, where each respective feedback loop generates a reflected sound pattern using the respective delay and gain values, and where the respective reflected sound pattern is added to the respective gain-multiplied reflected sound to form a respective feedback loop output signal;

a positioning filter unit to separate each of the feedback loop output signals from the feedback comb filter unit into a first channel reflected sound and a second channel reflected sound, by applying a time difference and a sound pressure difference between a two ears of a listener to each of the first channel and second channel reflected sounds, and by applying an interaural time difference (ITD) and applying different ILDs with respect to frequency bands; and a mixer unit to add all the positioned first channel reflected sounds, and to add all the positioned second channel reflected sounds, wherein the respective time differences, sound pressure differences, and the ILDs that are the basis of the respective gain values are calculated based on a size, a shape, a degree of sound absorption of the predetermined virtual room and a relative position of each of the two ears of the listener with respect to a respective sound source within the predetermined virtual room, and wherein the positioning filter unit comprises an ITD filter to reflect the time difference between the two ears of the listener and an ILD filter to reflect the sound pressure level difference between the two ears of the listener varying with respect to frequency, and the positioning filter unit outputs one of the first channel reflected sound and the second channel reflected sound without change and output the other of the first channel reflected sound and the second channel reflected sound through the ITD filter and the ILD filter.

3. A non-transitory computer readable recording medium having embodied thereon a computer program to execute a method of generating a spatial sound in a predetermined virtual room, comprising:

receiving an input sound signal;

applying a specified number of a plurality of delay values to the input sound signal to generate the specified number of a plurality of reflected sound signals;

multiplying each of the reflected sound signals by a respective gain value that is based on an interaural level difference (ILD) to adjust the volume of each reflected sound signal;

applying a respective feedback loop to each of the gain-multiplied reflected sound signals, wherein each of the respective feedback loops comprises a delay value and a gain value that are specific for its corresponding gain-multiplied reflected sound signal, and where each respective feedback loop generates a reflected sound pattern using the respective delay and gain values, and where the respective reflected sound pattern is added to the respective gain-multiplied reflected sound to form a feedback loop output signal;

separating each of the feedback loop output signals generated from the adding of the respective reflected sound patterns to the respective gain-multiplied reflected sounds into a first channel reflected sound and a second channel reflected sound, by applying a time difference and the sound pressure difference between two ears of a listener to each of the first channel and second channel reflected sounds, by positioning the first channel reflected sound and the second channel reflected sound by applying an interaural time difference (ITD) and different ILDs with respect to frequency bands, and by assigning different delay values to the first channel reflected sound and the second channel reflected sound with respect to a different incident angle of each sound; and adding all the positioned first channel reflected sounds to form a first output channel, and adding all the positioned second channel reflected sounds to form a second output channel, wherein the respective time differences, sound pressure differences, and the ILDs that are the basis of the respective gain values are calculated based on a size, a shape, a degree of sound absorption of the predetermined virtual room, and a relative position of each of the two ears of the listener with respect to a respective sound source within the predetermined virtual room.

* * * * *